Nov. 5, 1957 O. GIERWIATOWSKI 2,812,430

FREQUENCY MODULATION SIGNAL SEEKING TUNER

Filed Aug. 18, 1954

INVENTOR
Olgierd Gierwiatowski
BY L. D. Burch 2,812,430

FREQUENCY MODULATION SIGNAL SEEKING TUNER

Olgierd Gierwiatowski, Indian Rocks Beach, Fla., assignor to General Motors Corporation, Detroit, Mich., a corporation of Delaware Application August 18, 1954, Serial No. 450,700

4 Claims. (Cl. 250—20)

Figures 1, 2:
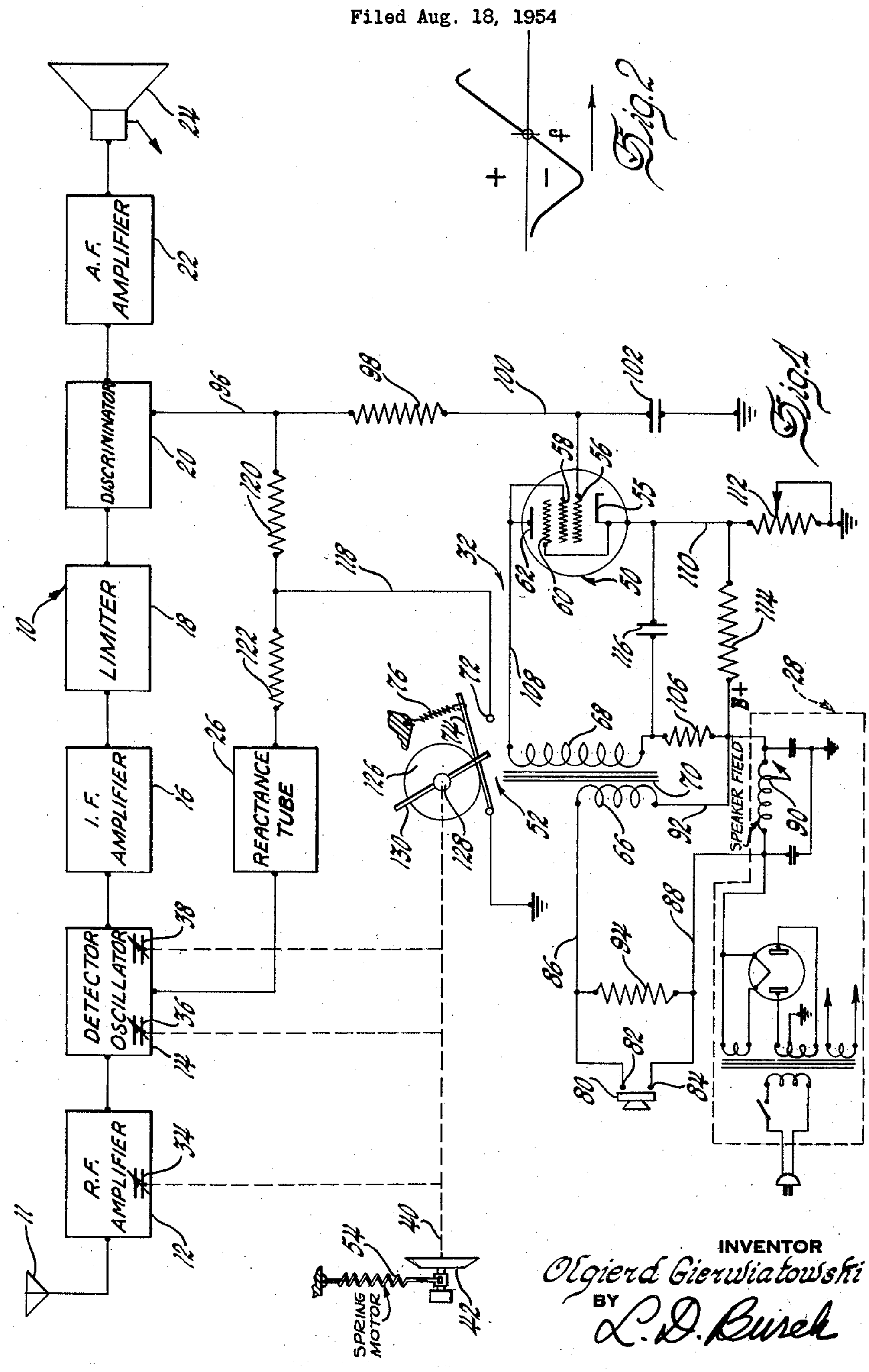

This invention relates to stop-on-signal or signal-seeking receivers and, more particularly, to signal-seeking tuned frequency modulation reecivers.

The invention has among its broader objects to provide a signal-seeking or self-tuning frequency modulation receiver that employs a signal-seeking tuner which is of simple design and operation, uses a minimum number of parts and is possessed of a high degree of tuning accuracy.

Other objects are to provide a signal-seeking frequency modulation tuner in which, in distinction to prior tuners of this character, the receiver is not required to be tuned manually within the frequency deviation zone of an FM signal before automatic self-tuning or signal-seeking variation can be initiated.

A particular object is to provide a signal-seeking FM receiver in which stoppage is effected at or near zero output voltage of the frequency modulation detector characteristic when the receiver is tuning into an incoming FM signal.

A related object is to provide a signal-seeking FM receiver in which tuning stoppage may be effected consistently on the same side of the discriminator characteristic.

Still other objects are to provide an improved signal-seeking tuning control in a frequency modulation receiver of the type which employs an automatic frequency control circuit and in which the automatic frequency control is disabled during signal-seeking tuning variation of the receiver.

The above and other objects, together with the advantages and structural and operating features, of the present invention will appear more fully from the following detailed description and drawings in which:

Fig. 1 is a diagrammatic and schematic electrical circuit diagram of a preferred embodiment of the present invention; and Fig. 2 is a discriminator characteristic curve used in explaining the operation of the present invention.

Referring to the drawings, there is shown in Fig. 1 a conventional superheterodyne frequency modulation receiver 10 of the discriminator-detector variety and which comprises, in the relative order named, an antenna 11, an R. F. amplifier 12, converter or detector-oscillator 14, I. F. amplifier 16, limiter 18, discriminator 20, audio frequency amplifier 22 and speaker 24. The receiver also is provided with automatic frequency control in the form of a reactance tube section 26 connected between the discriminator output and the tunable tank circuit of the oscillator, in known manner. The receiver further includes a conventional household receiver power supply, which is enclosed in dashed outline 28 and is illustrated schematically merely to illustrate its manner of association with a part of the stop-on-signal control circuit 32 of the present invention. For automobile receivers, for which signal-seeking receivers offer the greatest advantage, the high voltage power supply usually would be of the vibrator type supplied from the machine storage battery, which would also supply the filament and other power for the various tubes of the receiver and associated apparatus.

The R. F. amplifier 12 and detector-oscillator or converter 14 of the receiver include variable tuning elements such, for example, as the variable condensers 34, 36 and 38 which are adapted to be tuned in unison from a common shaft 40 that may have a manual tuning knob or dial 42 thereon.

The stop-on-signal control apparatus 32 of the present invention includes a multi-element electron tube 50, a relay 52 controlled thereby, and power drive means including a spring drive motor 54 for varying the tuning condensers progressively over the tuning range of the receiver. The electron tube 50 may be of the 6AK5 type, for example, having a cathode 55, control grid 56, plate-connected screen grid 58, cathode-connected suppressor grid 60, and a plate 62. The relay 52 is of the flux-latched type more fully shown and described in United States Patent 2,493,741 assigned to the present assignee and includes a holding or flux-latching winding 66 and stopping or flux-unlatching winding 68 wound on a common core 70 and has associated therewith a stationary contact 72 and grounded armature 74, the latter being normally held in the position shown by the spring 76.

A starting button 80 of the type adapted to provide momentary closure of a pair of switch contacts 82, 84 has the contact 82 thereof connected by conductor 86 to one side of the holding or operating coil 66 and the other contact 84 thereof connected by conductor 88 to the rectifier side of the speaker field 90 serving as a part of the ripple filter of the power supply 28. The other side of the holding coil 66 is connected by conductor 92 to the other side of the speaker field of the power supply. A bleeder resistor 94 shunting contacts 82 and 84 is connected between conductors 86 and 88 to supply a small amount of energizing current to the holding coil 66 of the relay 52 to hold the armature 74 in its flux-latched position, which is opposite to that shown, after the push button 80 has been depressed to initiate signal-seeking operation and then has been released.

The signal responsive relay control tube 50 has the control grid 56 thereof connected to receive an energizing or control signal from the output of the discriminator 20 which is connected by conductor 96, resistor 98 and conductor 100 to grid 56 and to ground through high frequency by-pass condenser 102, as shown. Operating voltage is supplied to the plate 62 of the relay or stop-on-signal control tube 50 in a circuit that extends from the output of the power supply and includes limiting resistor 106, unlatching winding 68 and conductor 108. Cathode 55 is connected to ground through conductor 110 and adjustable biasing resistor 112. An additional biasing or bleeder resistor 114 for applying a positive bias to the cathode is connected between B+ and the ungrounded or cathode side of resistor 112. A surge condenser 116 is connected to the junction between relay winding 68 and limiting resistor 106 and to the cathode 55.

The stationary contact 72 of the relay is connected by conductor 118 to the junction between a pair of resistors 120, 122 forming a voltage divider in the input circuit of the automatic frequency control reactance tube section 26 of the frequency modulation receiver.

The spring drive motor 54 is shown connected to the manual tuning knob or dial 42 of the receiver and to a stationary point such as the receiver chassis. The spring may thus be hand charged by turning the dial 40 to one extreme position of its range of movement. The relay armature 74 acts upon a brake drum 126 which is mounted on a shaft 128 coupled to the tuning shaft 40 and has a wind vane or air governor 130 thereon for controlling the speed of tuning variation. A related form of hand charged driving mechanism for signal-seeking tuners is shown in copending application Serial Number 195,161, filed November 13, 1950, in the name of Edward F. Andrews, also assigned to the present assignee. Where automatic recharging is desired, an arrangement such as that shown in the aforementioned Patent Number 2,493,741 could be employed.

The operation of the signal-seeking or stop-on-signal control apparatus in the frequency modulation receiver is as follows. Starting button 80 is depressed to supply full energizing current to relay winding 66, causing armature 74 to be attracted to core 70, releasing the brake drum 126 and closing contact 72. This initiates the progressive tuning variation of the receiver by the spring drive motor 54. The flux produced in the relay by the current flow through the bleeder resistor 94 supplements the residual flux in the relay holding coil 66 to retain the armature in its latched position upon release of the starting button. The control tube 50 is connected to receive a D. C. control signal from the discriminator output, and normally is in a slightly conducting condition in the absence of an FM signal in the discriminator output. The resistance 106, however, limits the plate current of the relay tube to so low a value that this current is insufficient to cause the opposing flux produced thereby in bucking winding 68 to unlatch the relay armature.

The direction of tuning variation movement of the condensers 34, 36 and 38 under the influence of the charged drive motor 54 is such that the discriminator voltage when tuning in an FM signal first goes negative, and then, after the negative peak is passed, goes first less negative and then positive over the linear portion of the discriminator characteristic, as is illustrated in Fig. 2. When the discriminator voltage is negative, the relay tube 50 becomes non-conductive, and the condenser 116 charges from B+ through resistance 106 and potentiometer 112. As the discriminator voltage swings rapidly less negatively or becomes more positive, the relay tube becomes conductive, and the surge condenser discharges through the bucking coil 68, sending a pulse of current therethrough of sufficient magnitude to create an opposing flux of sufficient intensity to buck that produced by the holding coil 66, and unlatches the relay armature into its open position shown. The armature is then in its brake application position to stop the spring motor and stops the receiver tuning generally on or within a fraction of a volt from zero discriminator output. The cathode resistor 112 and bleeder 114 from B+ thereto have been found to aid stopping somewhat closer to zero and consistently on the positive side of the discriminator characteristic, whereby stopping of the tuning variation is always in the same direction in relation to the direction of the tuning variation.

Upon stopping of the tuning variation, the input of the reactance tube section 26 of the receiver is ungrounded or, more properly, the reactance tube is connected to respond to the discriminator output and becomes effective to electronically regulate or control the tuning of the receiver so that it will be maintained exactly at the carrier frequency of the received signal, in known manner. By disabling the automatic frequency control of the receiver during the tuning operation and permitting its application after stopping-on-signal, any opposing effects that the reactance tube would otherwise have on the receiver tuning during self tuning operation thereof are eliminated, further contributing to the high speed automatic tuning feature obtained with the control apparatus of the present invention.

It also will be noted that the signal-seeking operation of the receiver is completely under the control of the control apparatus and that the signal-seeking or automatic tuning variation thereby is effective irrespective of the tuning condition of the receiver in the sense that no manual or coarse tuning of the receiver to a particular narrow tuning zone is required before the stop-on-signal control can become effective.

What is claimed is:

1. In a frequency modulation signal-seeking receiver having a tunable input section, a frequency modulation detector section, a power supply section, variable tuning means for varying the tuning of said input section, driving means for varying said tuning means progressively over the operating frequency range of said receiver, means for initiating tuning variation of said receiver by said driving means, and signal responsive control means connected to said detector section for stopping the tuning variation of the receiver upon the reception of an incoming signal, said signal responsive control means including relay means having a winding energizable upon the reception of an incoming signal for stopping said tuning variation of said receiver, a condenser connected in a continuously energizable charging circuit from said power supply section, and vacuum tube control means having an input circuit controlled from said detector section and an output circuit including said condenser and said relay winding and providing a discharge circuit for said condenser through said relay winding as the receiver tunes into said received signal.

2. Apparatus in accordance with claim 1 above wherein said control tube of said signal responsive control means has a cathode, grid and plate electrode and said signal responsive control means further includes means for applying a positive bias to said cathode for assuring stopping of said tuning variation on positive output voltages near zero of said detector section.

3. In a frequency modulation signal-seeking receiver having a tunable input section, a frequency modulation detector section providing in sequence negative, zero and positive output voltages as the receiver is tuned through a signal, a power supply section, variable tuning means for varying the tuning of said input section, driving means for varying said tuning means progressively over the operating frequency range of said receiver, and control means for initiating tuning variation of said receiver by said driving means and for stopping said tuning variation upon reception of a received frequency modulated signal encountered in the progressive variation of said tuning means, said means including a vacuum control tube having a plate, a cathode and a grid electrode with the grid electrode connected to the output of said detector section, a relay having an operating winding energizable from said power supply section for initiating said progressive tuning variation of said receiver by said drive means and a stopping winding energizable upon reception of an incoming signal to cease said tuning variation, said relay stopping winding connecting said plate of said vacuum tube to said power supply section and a condenser connected in a continuously energizable charging circuit extending from ground, said cathode electrode to said stopping winding connecting said plate electrode to said power supply section.

4. Apparatus in accordance with claim 1 above wherein said frequency modulation receiver further includes an automatic frequency control section and said signal responsive control means further includes means operated by said relay means disabling said automatic frequency control section of said receiver during signal-seeking tuning variation thereof.

References Cited in the file of this patent

UNITED STATES PATENTS

| | | |
|---|---|---|
| 2,487,772 | Nicholson et al. | Nov. 8, 1949 |
| 2,541,018 | Andrews | Feb. 13, 1951 |